United States Patent
Kudo et al.

Patent Number: 5,530,272
Date of Patent: Jun. 25, 1996

[54] HIGH ELECTRON MOBILITY TRANSISTOR INCLUDING PERIODIC HETEROJUNCTION INTERFACE

[75] Inventors: Akiyoshi Kudo; Kazuo Hayashi, both of Hyogo, Japan

[73] Assignee: Mitsubishi Denki Kabushiki Kaisha, Tokyo, Japan

[21] Appl. No.: 329,519

[22] Filed: Oct. 26, 1994

[30] Foreign Application Priority Data

Oct. 29, 1993 [JP] Japan .................................. 5-271484

[51] Int. Cl.$^6$ .................. H01L 31/0328; H01L 31/0336; H01L 31/072; H01L 31/109
[52] U.S. Cl. ........................ 257/192; 257/194; 257/286
[58] Field of Search .................... 257/187, 192, 257/194, 195, 285, 286

[56] References Cited

FOREIGN PATENT DOCUMENTS

| | | | |
|---|---|---|---|
| 256939 | 2/1990 | Japan . | |
| 417340 | 1/1992 | Japan . | |
| 4-186738 | 7/1992 | Japan . | |
| 5-55263 | 3/1993 | Japan . | |
| 6-163930 | 6/1994 | Japan | 257/194 |

OTHER PUBLICATIONS

"Patterning and overgrowth of nanostructure quantum well wire arrays by LP–MOVPE", Journal of Crystal Growth 107 (1991), pp. 591–597, Karam et al.

Primary Examiner—Ngân V. Ngô
Attorney, Agent, or Firm—Leydig, Voit & Mayer

[57] ABSTRACT

A compound semiconductor device includes a carrier supply layer supplying free charge carriers and having high dopant impurity concentration regions with a prescribed width, disposed in stripe shapes along a main current flow direction, parallel to each other, and spaced at an interval, and a carrier channel layer to which free charge carriers are supplied from the carrier supply layer including an electron channel having a high free carrier density at portions corresponding to respective high dopant impurity concentration regions of the carrier supply layer in the vicinity of a heterojunction interface. The heterojunction interface formed by the carrier channel layer and the carrier supply layer has a periodic undulating shape with convex portions and valley portions in stripe shapes extending parallel to the main current flow direction. A pseudo one-dimensional electron channel is formed in the vicinity of the high dopant impurity concentration region of the carrier supply layer whereby electron mobility is increased. The regions other than the high dopant impurity concentration regions of the carrier supply layer have a low dopant impurity concentration whereby the charge carrier quantity and output per unit chip area are increased, thereby increasing power output without increasing chip area.

7 Claims, 8 Drawing Sheets

Prior Art

HIGH ELECTRON MOBILITY TRANSISTOR INCLUDING PERIODIC HETEROJUNCTION INTERFACE

FIELD OF THE INVENTION

The present invention relates to a structure of a compound semiconductor device and a production method therefor and, more particularly, to a structure and a method of producing a compound semiconductor device such as a field effect transistor including a heterojunction.

BACKGROUND OF THE INVENTION

Figure 6:
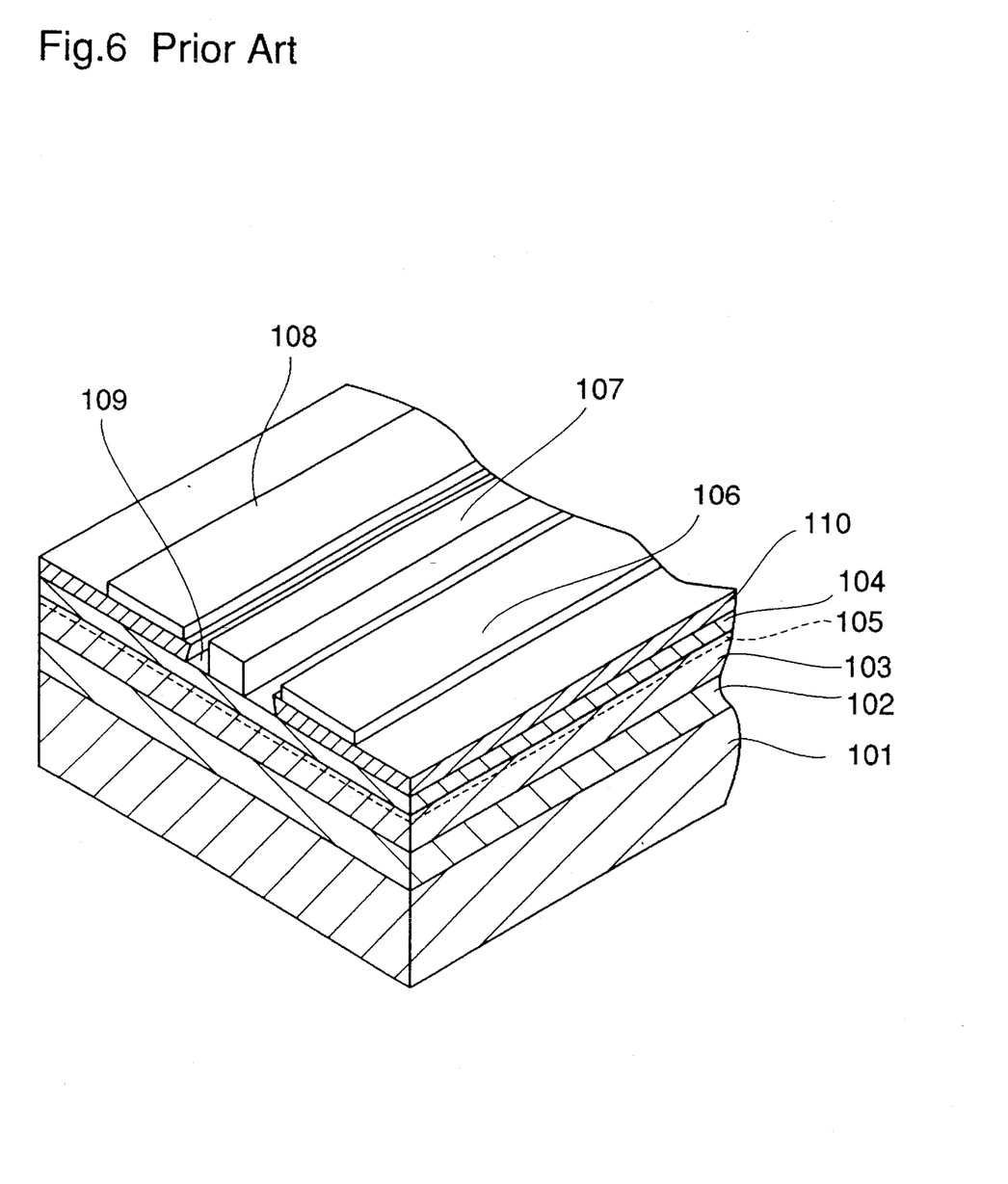
FIG. 6 is a perspective view illustrating a structure of a prior art field effect transistor.

FIG. 6 is a perspective view illustrating a structure of a prior art field effect transistor (hereinafter referred to as an FET) including a heterojunction. In the figure, reference numeral 101 designates a semi-insulating GaAs substrate. A non-doped GaAs buffer layer 102 having a thickness larger than 1000 Å is disposed on the semi-insulating GaAs substrate 101. An i(intrinsic)-type GaAs electron channel layer 103 having a thickness larger than 100 Å is disposed on the non-doped GaAs buffer layer 102. An AlGaAs electron supply layer comprising $Al_{0.25}Ga_{0.75}As$ containing Si as a donor impurity in a concentration of $1-3\times10^{18}cm^{-3}$ and having a thickness of 350 to 450 Å is disposed on the i-type GaAs electron channel layer 103. Reference numeral 105 designates a two dimensional electron gas formed at the heterojunction interface between the electron channel layer 103 and the electron supply layer 4. Reference numeral 110 designates an n-type GaAs contact layer containing Si in a concentration of $1-3\times10^{18}cm^{-3}$ and having a thickness of 100 to 3000 Å. A groove 109 is formed at the surface of the contact layer 110 reaching the electron supply layer 104, having a width of 100–3000 Å. A source electrode 106 is disposed on the contact layer 110, a drain electrode 108 is disposed on the contact layer 110, and a gate electrode 107 is disposed in contact with the electron supply layer 104 at the recess groove 109.

Figure 7A:
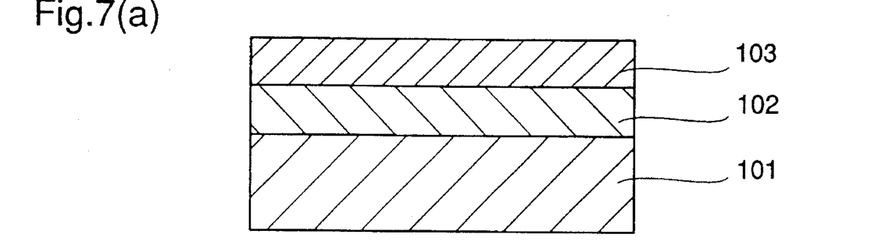
FIGS. 7(a)–7(d) are cross sectional views illustrating the prior art field effect transistor in respective production process steps.
Figure 7B:
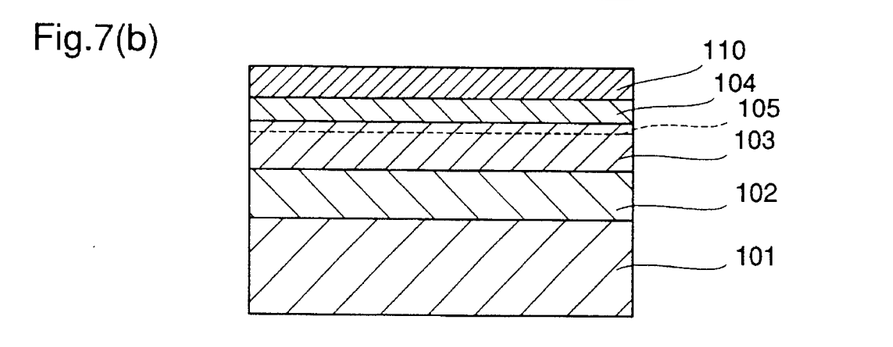
Figure 7C:
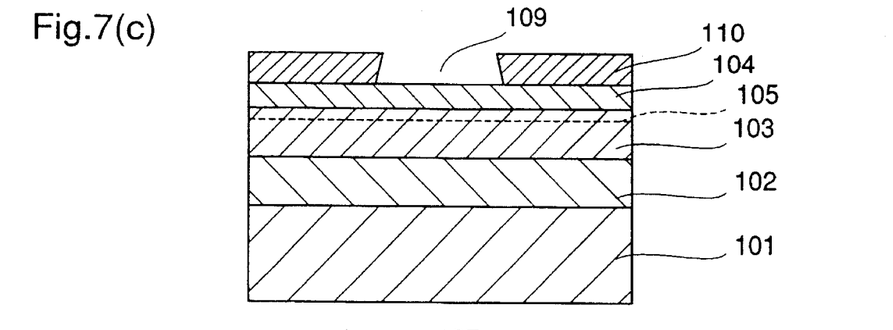
Figure 7D:
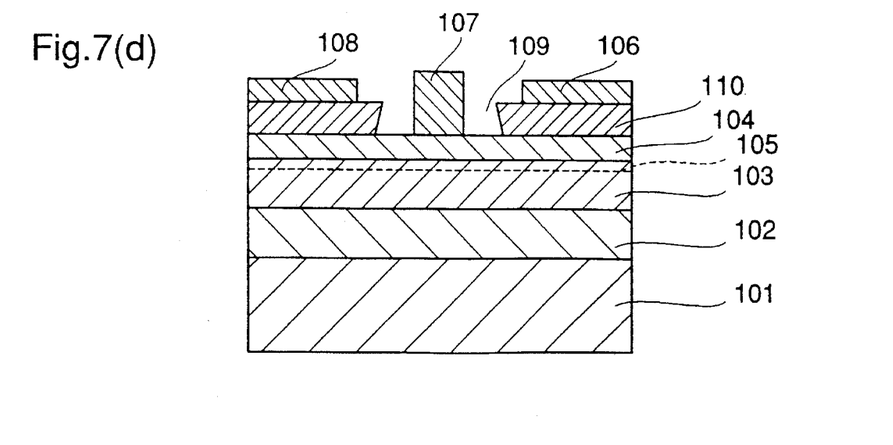

FIGS. 7(a)-7(d) are cross sections of a production flow for producing the prior art field effect transistor. A buffer layer 102 and an i-GaAs electron supply layer 103 including no impurities are successively epitaxially grown on the semi-insulating GaAs substrate 101 as shown in FIG. 7(a). Then, an AlGaAs electron supply layer 104 containing dopant impurities and an n-GaAs contact layer 109 are epitaxially grown on the electron supply layer 103 as shown in FIG. 7(b). The contact layer 109 is etched to reach the electron supply layer 104 to form a groove 109 for forming a gate electrode as shown in FIG. 7(c) and, thereafter, a source electrode 106, a drain electrode 108, and a gate electrode 107 are respectively formed as shown in FIG. 7(d).

In the field effect transistor having a heterojunction of AlGaAs and GaAs, electrons generated from the donor impurities in the AlGaAs electron supply layer 104 move to the electron channel layer 103 comprising GaAs having a larger electron affinity than AlGaAs and are stored at the heterojunction interface between AlGaAs and GaAs. As a result, a two dimensional electron gas 105 comprising electrons stored in a two dimensional shape is formed in the GaAs electron channel layer 103. Since no dopant impurities are in the two dimensional electron gas 105, when a current flows between the source electrode 106 and the drain electrode 108, scattering due to the Si donor impurities is reduced to a great extent, providing a high electron mobility device.

In the prior art field effect transistor, the heterojunction is planar and the heterojunction area per unit area of a chip is small, whereby the current flowing through the two dimensional electron gas is limited. Therefore, the chip area must be increased in order to increase the power output of the FET. In addition, due to the scattering of electrons in the channel width direction, the performance of the FET cannot be increased.

Japanese Published Patent Application Hei. 4-17340 discloses a semiconductor device having a structure that solves these problems. That semiconductor device has a periodic concave-convex structure including stripe shaped convex portions and concave portions extending in the direction of the current flow at the heterojunction interface. This semiconductor device has increased heterojunction area per unit chip area. In addition, because many electrons are stored in the electron channel layer in the vicinity of the convex portion of the heterojunction relative to the other areas, a one dimensional carrier density distribution is formed along the stripe shape of the convex portion, whereby a pseudo one dimensional electron gas is formed, preventing scattering of electrons in the channel width direction and increasing the mobility of the electrons.

In a semiconductor device having such a structure, however, the quantity of electrons necessary for forming a pseudo one dimensional electron gas at the convex portion depends on the amplitude and period of the concave and convex portions of the heterojunction interface.

SUMMARY OF THE INVENTION

It is an object of the present invention to provide a compound semiconductor device that can provide increased output and electron mobility without increasing chip area.

It is another object of the present invention to provide a method for producing the compound semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a compound semiconductor device includes a carrier supply layer supplying free carriers, a carrier channel layer to which free carriers are supplied from the carrier supply layer, and a heterojunction formed by the carrier channel layer and the carrier supply layer, wherein the heterojunction interface has an undulating shape having a period in stripe shaped convex and valley portions, extending in the direction of the main current flow, parallel to each other, and a plurality of spaced apart high dopant impurity concentration regions having a width in the carrier supply layer, in a stripe shape in the direction of the main current.

According to a second aspect of the present invention, the compound semiconductor device includes a region other than the region having a high dopant impurity concentration of the carrier supply layer including dopant impurities in a low concentration.

According to a third aspect of the present invention, the compound semiconductor device has a period at the heterojunction interface of 0.1 to 0.4 microns.

According to a fourth aspect of the present invention, the compound semiconductor device includes regions having a width, each region including a high concentration of dopant impurities, in the carrier supply layer part having respective periods at the heterojunction interface.

According to a fifth aspect of the present invention, the compound semiconductor device includes a high dopant impurity concentration region in the carrier supply layer at a portion confronting the convex part of the heterojunction interface in a periodic shape.

According to a sixth aspect of the present invention, the compound semiconductor device includes a high dopant impurity concentration region of the carrier supply layer confronting the valley part of the heterojunction interface.

According to a seventh aspect of the present invention, the compound semiconductor device includes a carrier supply layer supplying free carriers, a carrier channel layer to which free carriers are supplied from the carrier supply layer, and a heterojunction formed by the carrier channel layer and the carrier supply layer, wherein the heterojunction interface has an undulating shape with a period including stripe shaped convex and valley parts extending in the direction of the main current flow, parallel to each other, and inactive regions in the carrier supply layer arranged in the direction of the main current flow, parallel to each other, with a period larger than the period of the heterojunction interface.

According to an eighth aspect of the present invention, a method of producing a compound semiconductor device includes successively growing a buffer layer and a carrier channel layer on a semiconductor substrate, etching the carrier channel layer employing a first resist which includes a periodic pattern having stripes extending in the direction of the main current flow as a mask to form grooves in the carrier channel layer, making periodic grooves at the surface of the carrier channel layer, growing a first carrier supply layer on the carrier channel layer, after forming an approximately planar insulating film on the first carrier supply layer, selectively etching the insulating film and the first carrier supply layer successively to form a first carrier supply layer having a planar surface, growing the second carrier supply layer containing a dopant impurity in a high concentration on the first carrier supply layer, and etching the carrier supply layer employing a second resist mask that has the same period as the first resist to form grooves having a depth reaching the first carrier supply layer, giving the grooves at the surface of the first and the second carrier supply layer an undulating shape.

According to a ninth aspect of the present invention, a method of producing a compound semiconductor device includes successively growing a buffer layer and a carrier channel layer on a semiconductor substrate, etching the carrier channel layer employing a resist having stripes extending in the direction of the main current flow to form periodic grooves in the carrier channel layer, making the grooves of the surface of the carrier channel layer into an undulating shape, growing a first carrier supply layer containing dopant impurities in a high concentration on the carrier channel layer, after forming an approximately planar insulating film on the first carrier supply layer, successively selectively etching the insulating film and the first carrier supply layer to form a first carrier supply layer having a planar surface, and selectively etching the first carrier supply layer to expose a convex part of the carrier supply layer having an undulating shape to form a second carrier supply layer on the exposed carrier channel layer and the first carrier supply layer.

According to a tenth aspect of the present invention, a method of producing a compound semiconductor device includes successively growing a buffer layer and a carrier channel layer on a semiconductor substrate, etching the carrier channel layer employing a resist having periodic stripes extending in the direction of the main current flow as a mask to form grooves, making the grooves at the surface of the carrier channel layer into an undulating shape, growing a carrier supply layer containing dopant impurities on the surface of the carrier channel layer, and irradiating the structure with an ion beam employing a second resist that has stripes in the direction of the main current flow spaced at more than one period of the periodic shape at the surface of the carrier supply layer as a mask, thereby inactivating the dopant impurity in the carrier supply layer at the stripes.

According to the present invention, since the heterojunction interface formed by the carrier supply layer and the carrier channel layer has an undulating periodic shape with convex and valley portions extending in the direction of the main current flow, and a plurality of stripe shaped high dopant impurity concentration regions having respective widths in the carrier supply layer in the direction of the main current flow, a pseudo one dimensional electron channel can be formed in the vicinity of the high dopant impurity concentration region of the carrier supply layer, whereby the electron mobility can be increased.

According to the present invention, since a region other than the high dopant impurity concentration region of the carrier supply layer includes dopant impurities in a low concentration, the carrier quantity per unit area of a chip and the output per unit area can be increased, and the output can be increased without increasing the chip area.

According to the present invention, since the high dopant concentration region of the carrier supply layer is formed at the portion confronting the convex portion of the periodic heterojunction interface, a pseudo one dimensional electron channel can be formed at a convex portion of the heterojunction part of the carrier channel layer, whereby the electron mobility can be increased.

According to the present invention, the high dopant concentration region of the carrier supply layer is formed at a valley part of the undulating heterojunction interface, and a pseudo one dimensional electron channel can be formed at a valley part of the heterojunction part of the carrier channel layer, whereby the electron mobility is increased.

According to the present invention, since the heterojunction interface formed by the carrier supply layer and the carrier channel layer has an undulating periodic shape with convex and valley portions in stripes extending in the direction of the main current flow, and inactive regions in the direction of the main current flow parallel to each other with a spacing of more than one period of the heterojunction interface, a region where free carriers do not exist can be formed at a portion of the carrier channel layer adjacent the carrier supply layer that is inactivated, whereby scattering of the carriers moving in the carrier channel layer in a direction perpendicular to the direction of the main current flow can be suppressed, and electron mobility increased.

BRIEF DESCRIPTION OF THE DRAWINGS

FIGS. 2(a)–2(j) are cross sectional views illustrating the field effect transistor according to the first embodiment of the present invention in respective production process steps.

DETAILED DESCRIPTION OF THE PREFERRED EMBODIMENTS

Embodiment 1

Figure 1:
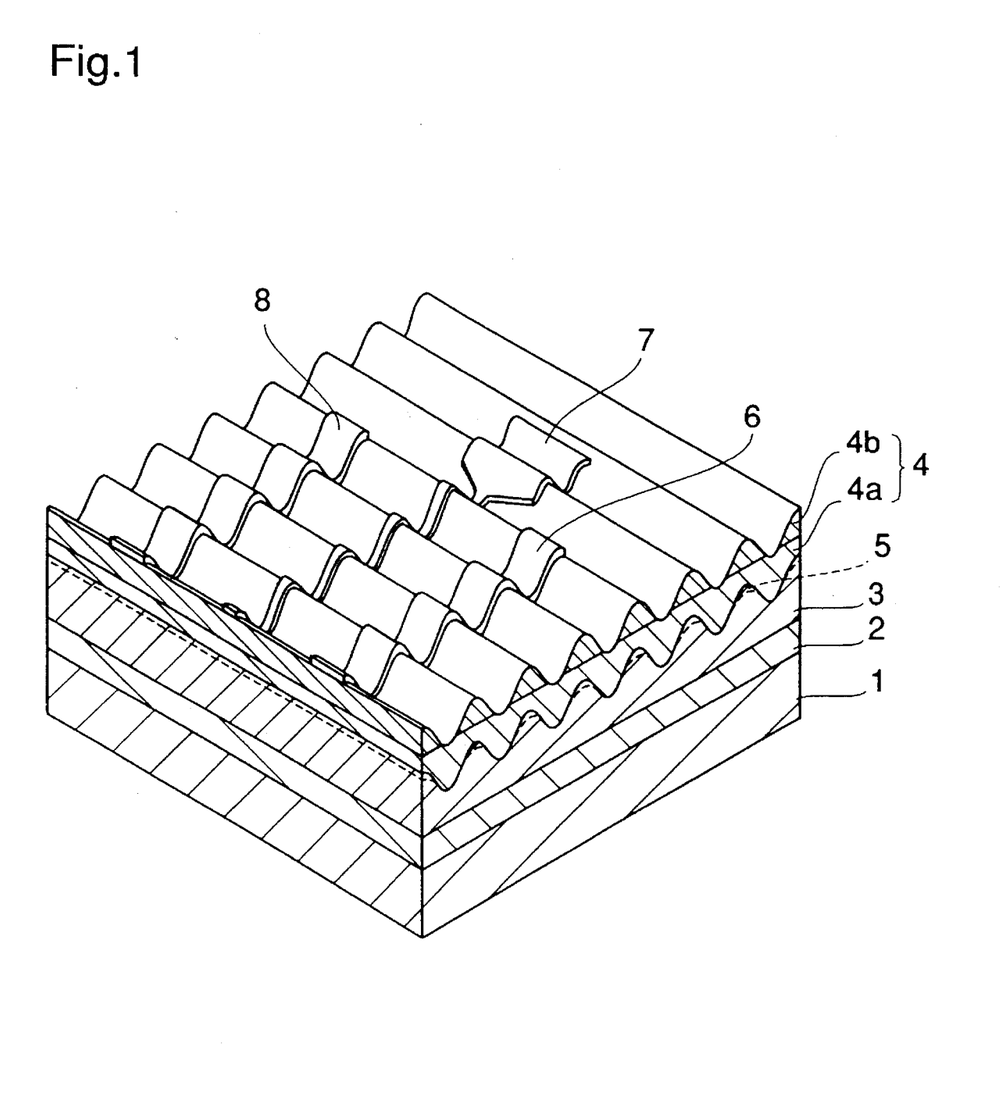
FIG. 1 is a perspective view illustrating a structure of a field effect transistor according to a first embodiment of the present invention.

FIG. 1 is a perspective view illustrating a field effect transistor (hereinafter referred to as an FET) according to a first embodiment of the present invention. In the figure, reference numeral 1 designates a semi-insulating GaAs substrate. A non-doped GaAs buffer layer 2 having a thickness of more than 1000 Å is disposed on the semi-insulating GaAs substrate 1. An i-type GaAs electron channel layer 3 having a thickness more than 100 Å is disposed on the non-doped GaAs buffer layer 2. An electron supply layer 4 having a thickness of about 350–450 Å including a non-doped $Al_{0.25}Ga_{0.75}As$ electron supply layer 4a and an $Al_{0.25}Ga_{0.75}As$ electron supply layer 4b containing Si as a donor impurity in a concentration of $1-3\times10^{18} cm^{-3}$ is disposed on the i-type GaAs electron supply layer 3. Reference numeral 5 designates an electron channel formed at the heterojunction interface between the electron channel layer 3 and the electron supply layer 4. Reference numerals 6, 8, and 7 designate, respectively, a source electrode, a drain electrode, and a gate electrode.

FIGS. 2(a) to 2(j) are cross-sectional views illustrating process steps for producing the semiconductor device according to the first embodiment of the present invention. In the figures, the same reference numerals are used to designate the same or corresponding portions as those shown in FIG. 1. Reference numerals 11 and 13 designate photoresist, and reference numeral 12 designates an insulating film comprising a material such as SiO.

Figure 2A:
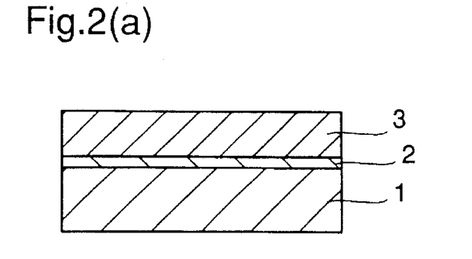
Figure 2B:
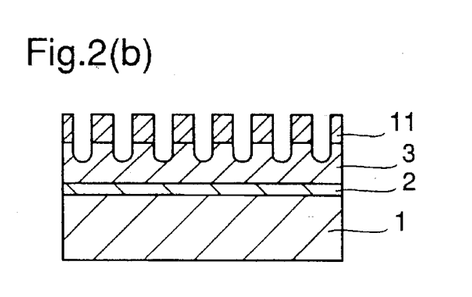

As shown in FIG. 2(a), a GaAs buffer layer 2, an i-type GaAs electron channel layer 3, and photoresist 11 are successively epitaxially grown on the semi-insulating GaAs substrate 1 by metal organic chemical vapor deposition (hereinafter referred to as MOCVD). Next, after a photoresist 11 is deposited, electron beam (hereinafter referred to as EB) direct drawing on the photoresist 11 forms a stripe shaped periodic pattern having a period of approximately 0.2 μm extending in a channel length direction. The i-type GaAs electron channel layer 3 is dry etched using the resist pattern as a mask to form grooves having a depth of approximately 0.5 μm (FIG. 2(b)). After removing the photoresist 11, in order to form a pattern of grooves on the surface of the GaAs electron channel layer 3 in a periodic undulating shape, the GaAs electron channel layer 3 is dry etched (FIG. 2(c)). Next, as shown in FIG. 2(d), a non-doped AlGaAs layer 4a having a thickness of approximately 0.5 μm is epitaxially grown on the GaAs electron channel layer 3 having an undulating surface as shown in FIG. 2(d). By ECRCVD, an insulating film 12, comprising a material such as SiO, is formed on the non-doped AlGaAs layer 4a to a thickness of about 0.5 μm (FIG. 2(e)). Then, a planar surface is formed, preferably by sputtering. As shown in FIG. 2(f), dry etching of the insulating film 12 comprising a material such as SiO employing a $CHF_3/O_2$ gas mixture and dry etching of the AlGaAs layer 4a employing a $CCl_2F_2/O_2$ gas mixture are successively carried out, thereby forming an AlGaAs layer 4a having a planar surface (FIG. 2(g)). The n-type AlGaAs layer 4b having a thickness of about 0.6 μm is epitaxially grown on the AlGaAs layer 4a by MBE (molecular beam epitaxy) (FIG. 2(h)). In addition, a photoresist 13 is formed on the n-type AlGaAs layer 4b, and the same pattern as that formed on the photoresist 11 is formed by the EB direct drawing method. This photoresist 13 is employed as a mask to form fine grooves opposite the valleys of the undulating surface of the GaAs electron channel layer 3 employing the resist 13 as a mask (FIG. 2(i)). Thereafter, after removing the photoresist 13, the surface of the n-type AlGaAs layer 4b is formed in an undulating periodic shape by dry etching as shown in FIG. 2(j), and a gate electrode 2, a source electrode 6, a drain electrode 8 are formed on the surface of the device, thereby producing the field effect transistor as shown in FIG. 1. A contact layer may be formed between the source electrode 6, and the drain electrode 8 and the electron supply layer 4.

In the FET of this embodiment, the AlGaAs layer 4b having donors supplying electrons is present only at an upper portion, i.e., in the vicinity of the convex parts of the heterojunction interface having an undulating shape. Accordingly, since many electrons are supplied only to the electron channel layer 3 in the vicinity of the convex parts of the undulating interface, the electrons are localized in the vicinity of the convex parts. Accordingly, it is possible to form a one dimensional electron channel along the stripes formed by the convex parts, whereby it is possible to make electrons flow pseudo one dimensionally along the stripe shape, thereby increasing the mobility of electrons in the field effect transistor.

Embodiment 2

Figure 3:
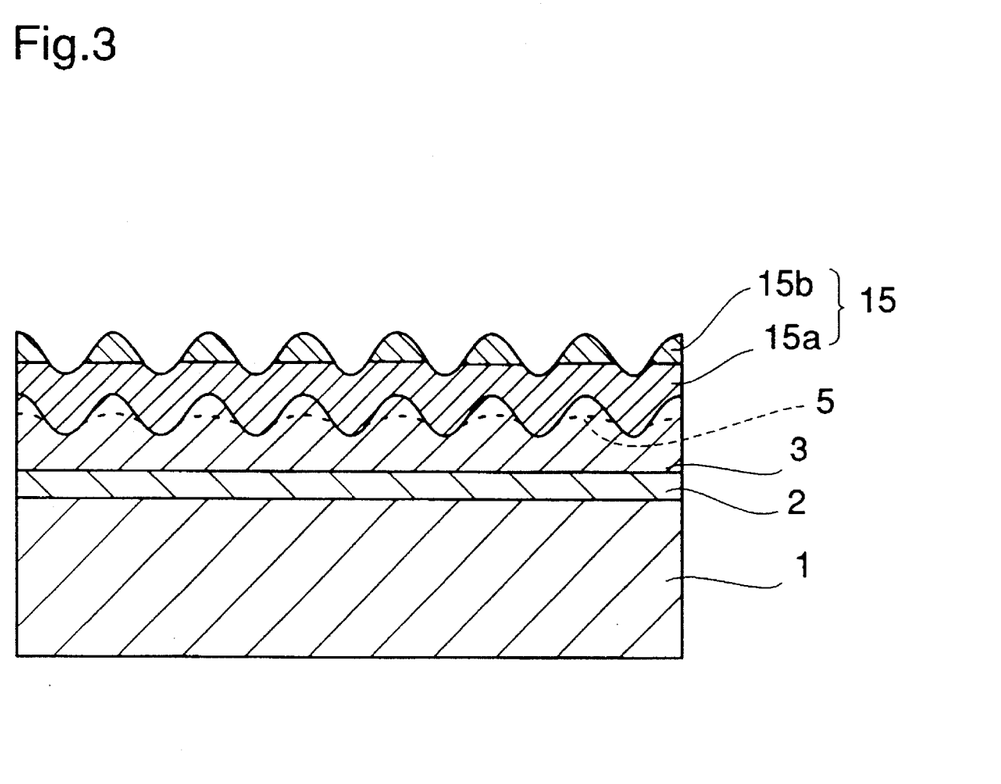
FIG. 3 is a cross sectional view illustrating a structure of a field effect transistor according to a second embodiment of the present invention.

FIG. 3 is a cross-sectional view illustrating a field effect transistor according to a second embodiment of the present invention. In the figure, the same reference numerals as those in FIG. 1 are used to designate the same or corresponding portions. Reference numeral 15 designates an electron supply layer including an $Al_{0.25}Ga_{0.75}As$ electron supply layer 15a including Si as a donor impurity in a concentration of $1-3\times10^{18} cm^{-3}$ and an $Al_{0.25}Ga_{0.75}As$ electron supply layer 15b containing Si in a higher concentration than in the electron supply layer 15a. This electron supply layer 15 has a thickness of 350–450 Å. The field effect transistor of this second embodiment can be produced by the same method as used for the first embodiment by replacing the non-doped AlGaAs layer 4a with the AlGaAs layer 15a and the AlGaAs layer 4b with the AlGaAs layer 15b.

In this second embodiment, the AlGaAs layer 15b in the convex parts of the heterojunction having an undulating shape is doped with Si to a high concentration and the AlGaAs layer 15a is doped with Si to a lower concentration. Therefore, as in the first embodiment, it is possible to locally concentrate the electrons from the AlGaAs layer 15b at the convex parts of the heterojunction, thereby forming a pseudo one dimensional channel. In addition, electrons are supplied to parts other than the vicinity of the convex parts of the heterojunction having the undulating shape comprising the AlGaAs layer 15a, whereby the quantity of electrons that is supplied to the heterojunction part per unit chip area is increased, thereby increasing the power output of the FET.

Thus a high power output FET is provided without increasing chip area.

Since in this second embodiment an AlGaAs layer containing Si in a high concentration is disposed at the upper part of the convex parts of the heterojunction formed in an undulating shape and an AlGaAs layer containing Si in a low concentration is disposed at a portion other than that, it is possible for electrons to flow pseudo one dimensionally at the convex portion and to increase the quantity of electrons supplied per unit chip area. Therefore, an FET having an increased electron mobility and a high power output with a small size is provided.

Embodiment 3

Figure 4:
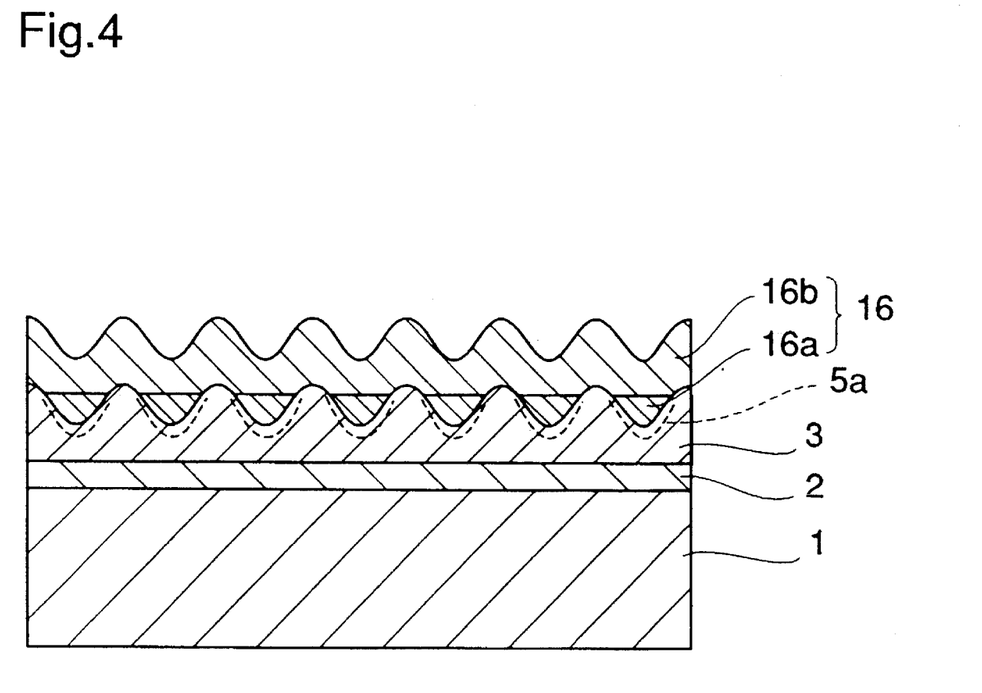
FIG. 4 is a cross sectional view illustrating a structure of a field effect transistor according to a third embodiment of the present invention.

FIG. 4 is a cross sectional view illustrating a structure of a field effect transistor according to a third embodiment of the present invention. In the figure, the same reference numerals as those in FIG. 1 are used to designate the same or corresponding portions. Reference numeral 16 designates an electron supply layer including an $Al_{0.25}Ga_{0.75}As$ electron supply layer 16a containing Si in a concentration of $1-3 \times 10^{18}$ cm$^{-3}$ and a non-doped $Al_{0.25}Ga_{0.75}As$ layer 16b. The electron supply layer 16 has a thickness of about 350–450 Å. Reference numeral 5a designates an electron channel.

The field effect transistor of the third embodiment can be produced by the same production process as used for the first embodiment by replacing the electron supply layer 4a with the electron supply layer 16a and the electron supply layer 4b with the electron supply layer 16b, and etching the electron supply layer 4a to such a degree that the convex portions of the electron supply layer 3 are exposed during the etching process shown in FIG. 2(f).

In the field effect transistor of this third embodiment, since the electron supply layer 16a containing dopant impurities that can supply electrons in a high concentration is disposed in the valley portions of the heterojunction, it is possible to form a one dimensional channel at the stripe shaped valley portions, localizing electrons in the valley portions. In addition, it is possible to increase the heterojunction area in the vicinity of the electron supply layer by providing the electron supply layer 16a at the valley portions, whereby the quantity of electrons that is supplied to the heterojunction part per unit chip area can be increased.

In the third embodiment, since the AlGaAs layer containing Si in a high concentration is disposed at the upper part of the valley portion of the undulating heterojunction, it is possible to form a pseudo one dimensional electron channel at the valley part. It is possible to increase the quantity of electrons supplied per unit chip area. Therefore, an FET having an increased electron mobility and a high power output with a small area is achieved.

While in the embodiments described above a stripe shaped high dopant impurity concentration region is provided at the electron supply layer opposite the convex portions or the valley portions of the heterojunction interface, the present invention can be also applied where a stripe shaped high dopant impurity concentration region is located on the convex or valley portions of a region other than a heterojunction interface with the same effects.

Embodiment 4

Figure 5:
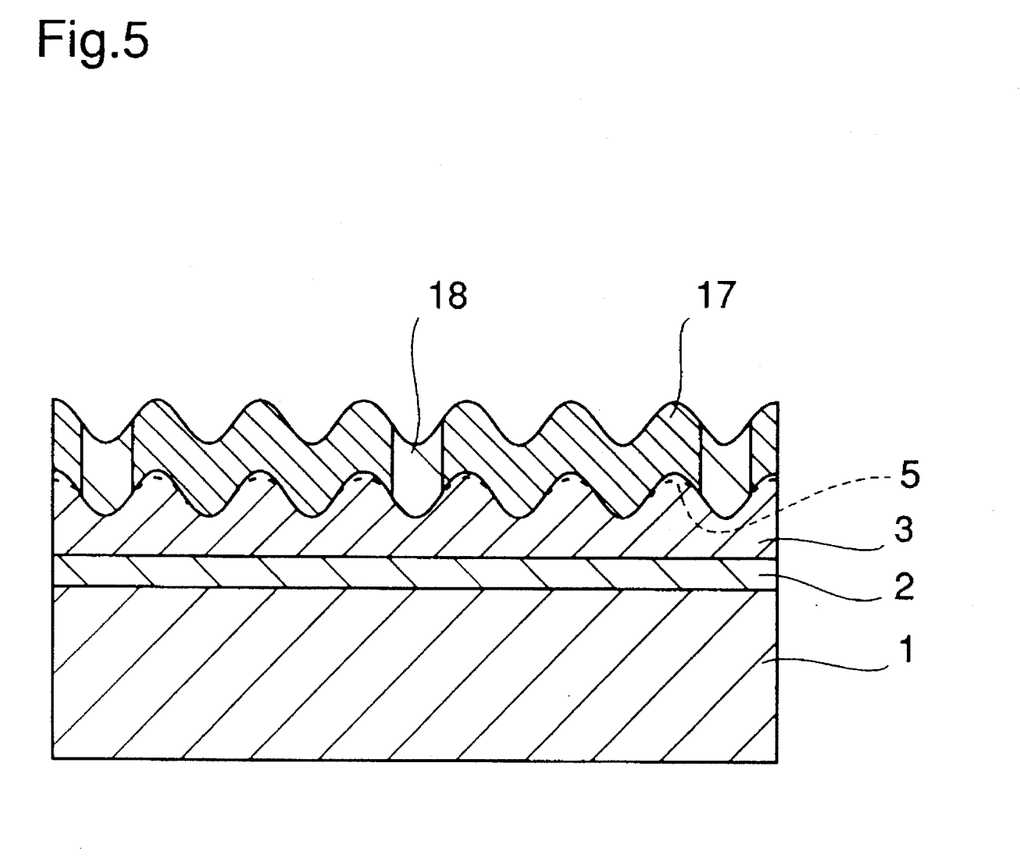
FIG. 5 is a cross sectional view illustrating a structure of a field effect transistor according to a fourth embodiment of the present invention.

FIG. 5 is a diagram illustrating a structure of a field effect transistor according to a fourth embodiment of the present invention. In the Figure, the same reference numerals as those shown in FIG. 1 designate the same or corresponding portions. Reference numeral 17 designates an $Al_{0.25}Ga_{0.75}As$ electron supply layer containing Si in a concentration of $1-3 \times 10^{18}$ cm$^{-3}$. Reference numeral 18 designates a stripe shaped inactive regions having a predetermined width, located on the heterojunction of the electron supply layer 17 at predetermined intervals. More particularly, the inactive regions 18 are formed at each third periodic period on the valley portions, of the undulating heterojunction interface.

Figure 2C:
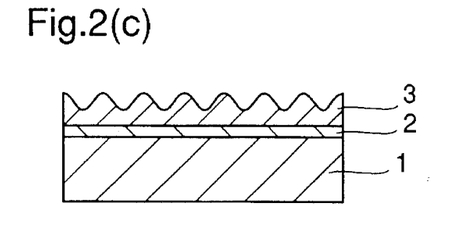
Figure 2D:
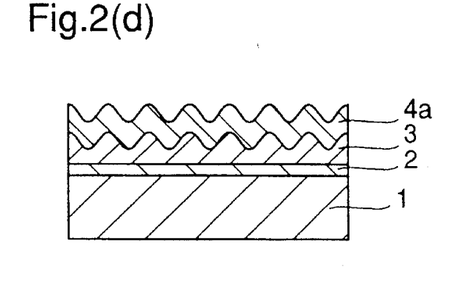
Figure 2E:
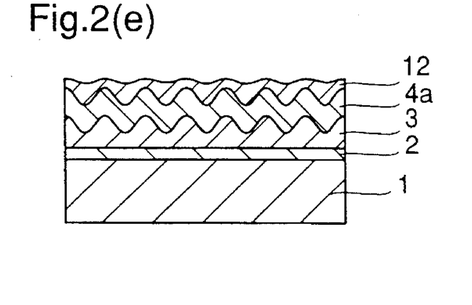
Figure 2F:
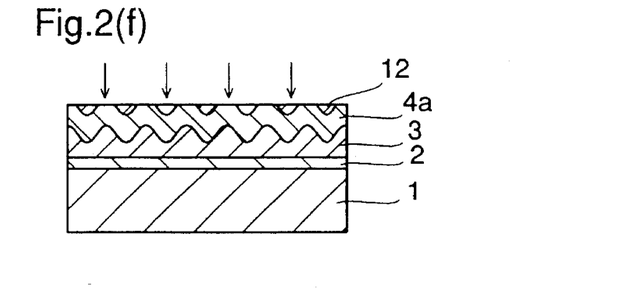
Figure 2H:
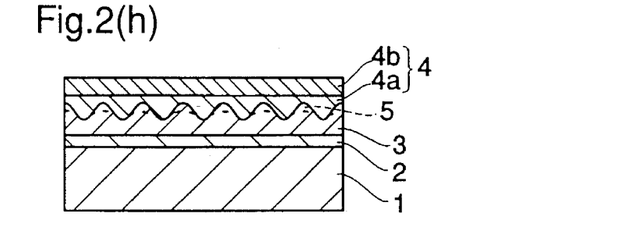
Figure 2I:
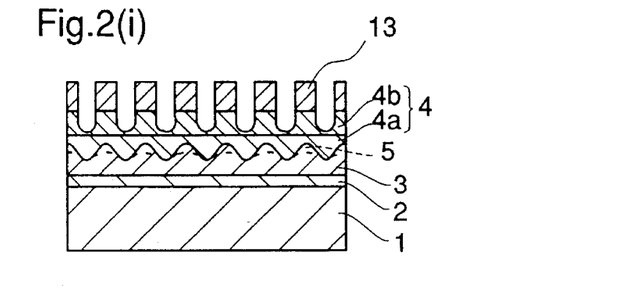
Figure 2J:
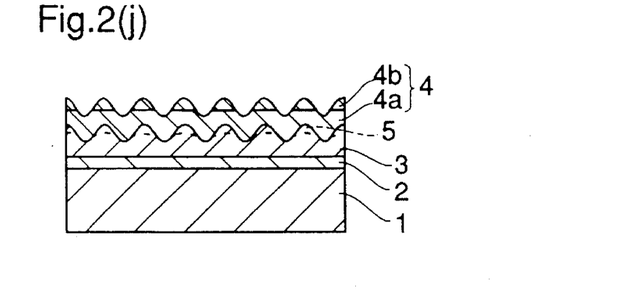

In the field effect transistor according to the fourth embodiment, the surface of the electron channel layer 3 is formed in an undulating shape as shown in FIG. 2(c) for the first embodiment, the electron supply layer 17 is formed on the electron channel layer 3, and an ion beam, such as a hydrogen ion beam, is used to irradiate the electron supply layer 17 at the valley portions at the predetermined interval employing a mask or the like, thereby producing inactive regions 18 in which the Si dopant impurity is inactivated.

In the field effect transistor of this embodiment, electrons are localized at convex parts of the heterojunction formed at the junction surface between the electron supply layer 17 and the electron channel layer 3 to form an electron channel 5, a pseudo one dimensional flow of electrons is enabled, and electrons are not supplied from the inactive regions 18 on the valley parts. Therefore, scattering of electrons in the channel width direction is reduced in the electron channel layer 3 in the vicinity of the inactive regions 18, thereby reducing noise. In addition, the area of the heterojunction in contact with the electron supply layer 17 supplying electrons is increased relative to the conventional FET which has no heterojunction in an undulating shape, whereby power output can be increased without increasing chip area.

According to this fourth embodiment, since the heterojunction has an undulating shape and the electron supply layer 17 on the valley parts of this undulating shape at a predetermined interval is inactivated, a pseudo one dimensional electron channel can be formed at the stripe shaped convex part. Also, scattering of electrons in the channel width direction is prevented. Further, the heterojunction area can be increased, so that a field effect transistor having an increased electron mobility and a high power output with a small size is provided.

While in the fourth embodiment the electron supply layer 17 located on valley portions of the undulating surface is inactivated, if the interval between the inactivated regions is a predetermined distance larger than one period of the undulating interface, the electron supply layer can be inactivated with the same effect as in the fourth embodiment.

Figure 8:
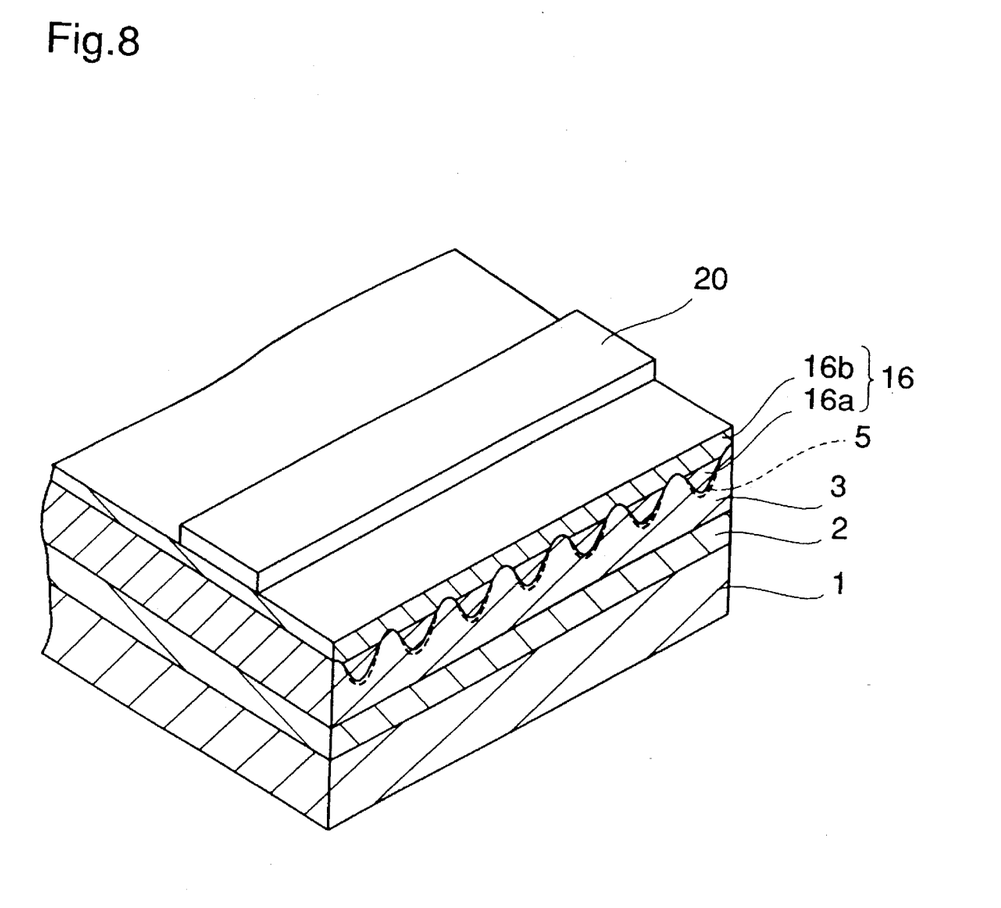
FIG. 8 is a perspective view illustrating an alternative of a field effect transistor according to the third embodiment of the present invention.

While in the third and fourth embodiments the source electrode, the drain electrode, and the gate electrode are formed in accordance with the undulating shape of the AlGaAs electron supply layer, the gate electrode 20 can have a planar surface after flattening the surface of the electron supply layer 16 of the FET shown in the third embodiment with the same effects as in the third and fourth embodiments.

According to the present invention, a heterojunction interface of the carrier supply layer and the carrier channel layer has an undulating periodic shape including stripe shaped convex and valley parts extending parallel to the direction of the main current flow, and a plurality of high dopant impurity concentration regions having a predetermined width are formed in stripe shapes on the carrier supply layer in the direction of the main current flow, parallel to each other at a predetermined interval. Therefore, a pseudo one dimensional electron channel can be produced in the vicinity of the high dopant concentration region of the carrier supply layer, whereby a compound semiconductor device that has improved electron mobility and a high efficiency is produced.

According to a second embodiment of the present invention, a region other than the high dopant concentration region of the carrier supply layer is formed including carriers in a low concentration and the charge carrier supply per unit area for a chip is increased. Therefore, the power output per unit area is increased, and a compound semiconductor device having a high power output without increasing chip area and a high efficiency is obtained.

According to a third embodiment of the present invention, a high dopant concentration region of the carrier supply layer is located opposite convex portions of the heterojunction interface having an undulating shape, and a pseudo one dimensional electron channel is formed at the convex parts of the heterojunction, whereby a compound semiconductor device having increased electron mobility and a high efficiency is obtained.

According to a fourth embodiment of the present invention, high dopant concentration regions of the carrier supply layer are located opposite the valley parts of the heterojunction interface having an undulating shape and a pseudo one dimensional electron channel is located at the valley parts of the heterojunction part of the carrier channel layer. Therefore, a compound semiconductor device having increased electron mobility and high efficiency is obtained.

According to a fifth embodiment of the present invention, a heterojunction interface produced by the carrier supply layer and the carrier channel layer has a periodic undulating shape and stripe shaped convex parts and valley parts extending parallel to the direction of the main current flow. Inactive regions arranged in the direction of the main current flow are located in the carrier supply layer at an interval larger than the period of the undulating heterojunction interface. Therefore, regions where free carriers do not exist are located at the inactivated carrier supply regions of the carrier channel layer, whereby electron scattering in a direction perpendicular to the direction of the main current flow is reduced and a compound semiconductor device having improved electron mobility and high performance is produced.

What is claimed is:

1. A compound semiconductor device comprising:

a first semiconductor carrier supply layer for supplying free charge carriers; and a second semiconductor carrier channel layer to which the free charge carriers are supplied from the carrier supply layer, the carrier channel layer and the carrier supply layer contacting each other at a heterojunction interface having a periodic undulating shape including convex parts and valley parts forming stripes extending parallel to a direction of main current flow, the carrier supply layer including a plurality of high dopant impurity concentration regions having a width, disposed in stripe shapes along the direction of main current flow, parallel to each other and spaced at a regular interval, an electron channel having a high density of free charge carriers being produced at locations corresponding to respective high dopant impurity concentration regions of said carrier supply layer in the vicinity of the heterojunction interface.

2. The compound semiconductor device of claim 1 wherein the carrier supply layer includes low dopant impurity concentration regions having a low dopant impurity concentrations relative to the high dopant impurity concentration regions, the low dopant impurity concentration regions being located at regions other than the high dopant impurity concentration regions.

3. The compound semiconductor device of claim 1 wherein the periodic undulating shape of the heterojunction interface has a period of 0.1 to 0.4 μm.

4. The compound semiconductor device of claim 1 including a high dopant impurity concentration region of the carrier supply layer corresponding to each period of the periodic undulating heterojunction interface.

5. The compound semiconductor device of claim 1 wherein a high dopant impurity concentration region of the carrier supply layer is disposed opposite each convex part of the periodic undulating heterojunction interface.

6. The compound semiconductor device of claim 1 wherein a high dopant impurity concentration region of the carrier supply layer is disposed opposite each valley part of the periodic undulating heterojunction interface.

7. A compound semiconductor device comprising:

a first semiconductor carrier supply layer for supplying free charge carriers; and a second semiconductor carrier channel layer for receiving free charge carriers from the carrier supply layer, the carrier channel layer and the carrier supply layer contacting each other at a heterojunction interface having a periodic undulating shape including convex portions and valley portions forming stripes extending parallel to a direction of main current flow, the carrier supply layer having inactive regions disposed along the direction of the main current flow and spaced at an interval larger than a period of the periodic undulating heterojunction interface, the inactive regions being parallel to each other, the carrier channel layer having electron channels having a high free charge carrier density at the convex portions of the heterojunction interface and regions where free charge carriers do not exist adjacent the inactive regions of the carrier supply layer at the periodic undulating heterojunction interface.

* * * * *